(12) United States Patent
Blaum et al.

(10) Patent No.: US 9,665,590 B2
(45) Date of Patent: *May 30, 2017

(54) BITMAP COMPRESSION FOR FAST SEARCHES AND UPDATES

(71) Applicant: International Business Machines Corporation, Armonk, NY (US)

(72) Inventors: Mario Blaum, San Jose, CA (US); Alberto Nunez Covarrubias, Madrid (ES); Steven R. Hetzler, Los Altos, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 8 days.

This patent is subject to a terminal disclaimer.

(21) Appl. No.: 14/607,178

(22) Filed: Jan. 28, 2015

(65) Prior Publication Data

US 2015/0142763 A1    May 21, 2015

Related U.S. Application Data

(62) Division of application No. 12/830,374, filed on Jul. 5, 2010, now Pat. No. 8,989,507.

(51) Int. Cl.
*G06K 9/00* (2006.01)
*G06F 17/30* (2006.01)
*H03M 7/30* (2006.01)

(52) U.S. Cl.
CPC .. *G06F 17/30153* (2013.01); *G06F 17/30324* (2013.01); *H03M 7/30* (2013.01)

(58) Field of Classification Search
USPC .................................................. 382/232–253
See application file for complete search history.

(56) References Cited

U.S. PATENT DOCUMENTS

| | | |
|---|---|---|
| 3,833,900 A | 9/1974 | Bahl et al. |
| 5,363,098 A | 11/1994 | Antoshenkov |
| 5,901,251 A | 5/1999 | Rust |
| 6,205,442 B1 | 3/2001 | Cohen et al. |
| 6,266,662 B1 | 7/2001 | Ozbutun et al. |

(Continued)

OTHER PUBLICATIONS

Bookstein et al., "Models of Bitmap Generation—A Systematic-Approach to Bitmap Compression," ISSN: 0306-4573; Database: SciSearch(R); Information Processing & Management, vol. 28, No. 6; p. 735-748, 1992.

(Continued)

*Primary Examiner* — Alex Liew
(74) *Attorney, Agent, or Firm* — Cantor Colburn LLP; Bryan W Butler

(57) ABSTRACT

Bitmap compression for fast searches and updates is provided. Compressing a bitmap includes receiving a bitmap to compress, and reading the bitmap to determine a value of a bit location for all bits in the bitmap. In one embodiment, a compressed bitmap is created by encoding a variable number of bytes to represent a distance between adjacent 1s in the uncompressed bitmap. In another embodiment, a compressed bitmap is created by representing a distance between adjacent 1s in the uncompressed bitmap using a plurality of bits, and encoding a marker word to indicate the number of bits used to represent the distance.

4 Claims, 8 Drawing Sheets

(56) References Cited

U.S. PATENT DOCUMENTS

| | | |
|---|---|---|
| 7,212,313 B1 | 5/2007 | Hoel |
| 2003/0035585 A1 | 2/2003 | Osborne et al. |
| 2004/0090351 A1 | 5/2004 | Wu et al. |
| 2004/0105497 A1* | 6/2004 | Takakura ............ H04N 19/176 375/240.23 |
| 2006/0212672 A1 | 9/2006 | Chandrasekaran et al. |
| 2007/0094287 A1 | 4/2007 | Wang et al. |
| 2007/0195369 A1 | 8/2007 | McDowell et al. |

OTHER PUBLICATIONS

Goodell H, "Forth Extensions: A Note on Bitmaps," ISSN: 0738-2022; Database: INSPEC; Journal of Forth Application and Research, vol. 1, No. 2, pp. 73-75; 1983.

\* cited by examiner

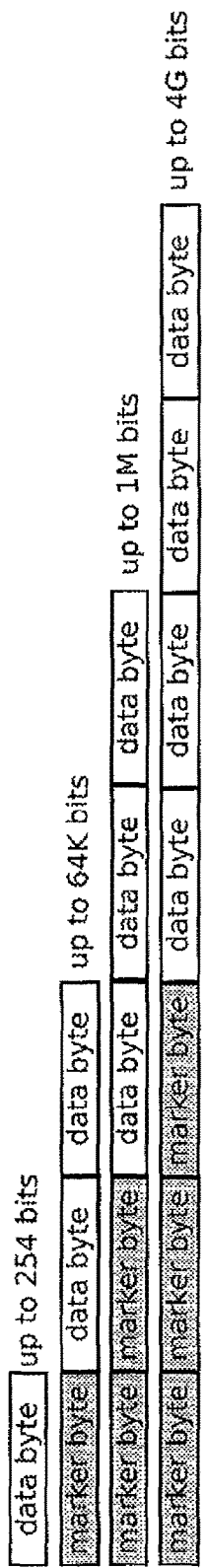
FIG. 8
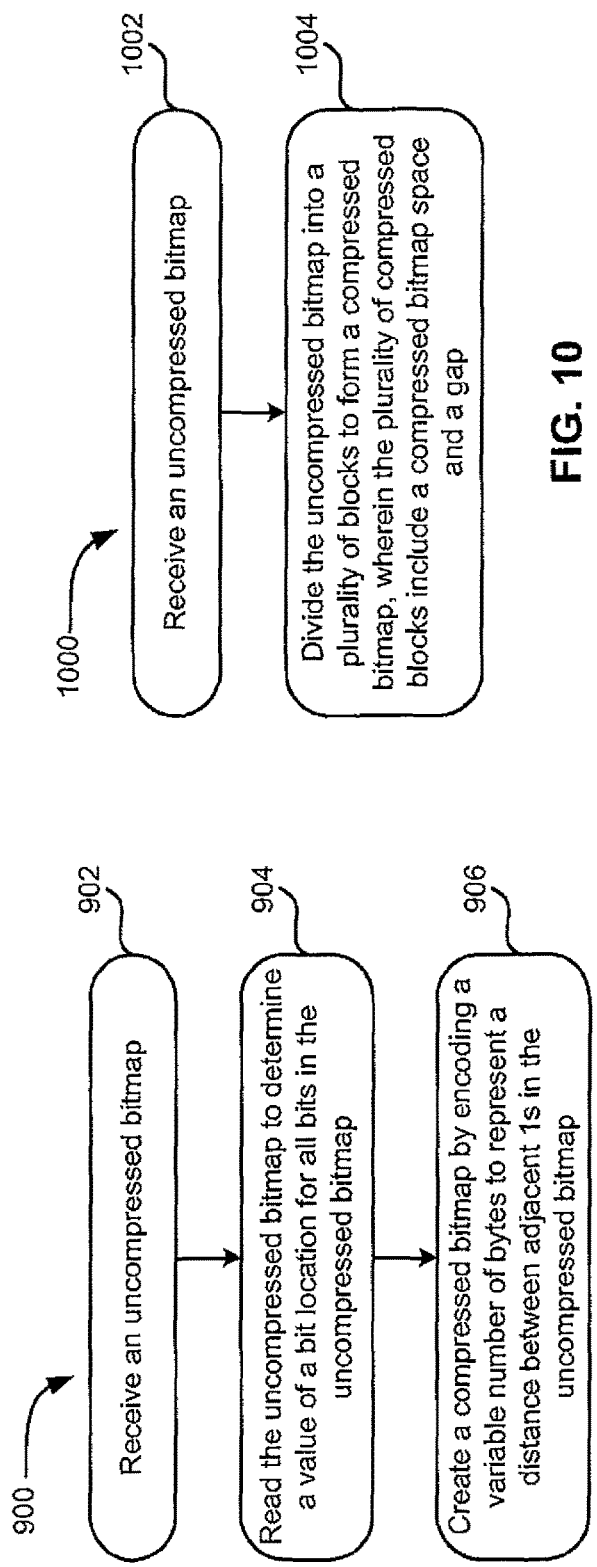
FIG. 10
FIG. 9

BITMAP COMPRESSION FOR FAST SEARCHES AND UPDATES

This application is a divisional of the legally related U.S. application Ser. No. 12/830,374 filed Jul. 5, 2010, which is fully incorporated herein by reference.

BACKGROUND

The present invention relates generally to bitmap compression, and particularly to methods for managing and compressing bitmaps.

Currently, bitmap structures are widely used in various fields of computer science, such as Database Management Systems and File Systems among others. These bitmap structures, or bitmaps, require a considerable amount of space to store the bitmap. For example, in a File System, one bit is typically used to represent a disk block. Presently, general purpose disks can handle terabytes (TB) of space, which means a large bitmap is required to manage all space in each disk. In Database Management Systems, bitmaps are typically used to accelerate decision support queries, where each bit is mapped to a corresponding record. Thus, a bitmap is set if the corresponding record has a property (P). In many cases, the bitmap is stored in a secondary storage device to save space in principal memory (such as RAM, ROM, flash, etc.). Generally, there is a considerable delay because each time that a bit that is to be accessed is stored on disk, the block that contains that bit is read from the disk and then stored in memory. Using compression techniques, the bitmap can be stored completely in principal memory, such as RAM, thus reducing delays improving the performance of the system.

Methods for managing bitmaps for storage systems with large caches are particularly prone to these performance delays. A cache comprising inexpensive consumer flash of around 5% of the total disk storage can improve the system performance by a factor of about four. Such caches typically have a large bitmap to identify the disk blocks residing in the cache. The bitmap requires frequent updates as data is placed in and removed from the cache. Compressing such bitmaps may reduce the cost associated with the bitmap memory.

SUMMARY

According to one embodiment, a method for compressing a bitmap includes receiving an uncompressed bitmap to compress, reading the uncompressed bitmap to determine a value of a bit location for all bits in the uncompressed bitmap, and creating a compressed bitmap by encoding a variable number of bytes to represent a distance between adjacent 1s in the uncompressed bitmap.

In another embodiment, a method for compressing a bitmap includes receiving an uncompressed bitmap to compress, reading the uncompressed bitmap to determine a value of a bit location for all bits in the uncompressed bitmap, and creating a compressed bitmap by representing a distance between adjacent 1s in the uncompressed bitmap using a plurality of bits, and encoding a marker word to indicate the number of bits used to represent the distance.

According to another embodiment, a method for compressing a bitmap includes receiving an uncompressed bitmap, and dividing the uncompressed bitmap into a plurality of blocks to form a compressed bitmap, wherein the plurality of blocks include a compressed bitmap space and a gap.

In one embodiment, a computer program product for compressing a bitmap includes a computer readable storage medium having computer readable program code embodied therewith. The computer readable program code comprises computer readable program code configured to receive an uncompressed bitmap to compress, computer readable program code configured to read the uncompressed bitmap to determine a value of a bit location for all bits in the uncompressed bitmap, and computer readable program code configured to create a compressed bitmap. This computer readable program code performs at least one of: encoding a variable number of bytes to represent a distance between adjacent 1s in the uncompressed bitmap; dividing the uncompressed bitmap into a plurality of blocks including a compressed bitmap space and a gap; and representing a distance between adjacent 1s in the uncompressed bitmap using a plurality of bits and encoding a marker word to indicate the number of bits used to represent the distance.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the invention, as well as a preferred mode of use, reference should be made to the following detailed description read in conjunction with the accompanying drawings, in which:

FIG. 8 is a simple diagram of a bitmap encoding structure using marker bytes (words) according to one embodiment.

FIG. 9 is a flow chart of a method for compressing a bitmap, according to one embodiment.

FIG. 10 is a flow chart of a method for compressing a bitmap, according to one embodiment.

DETAILED DESCRIPTION

Figure 1:
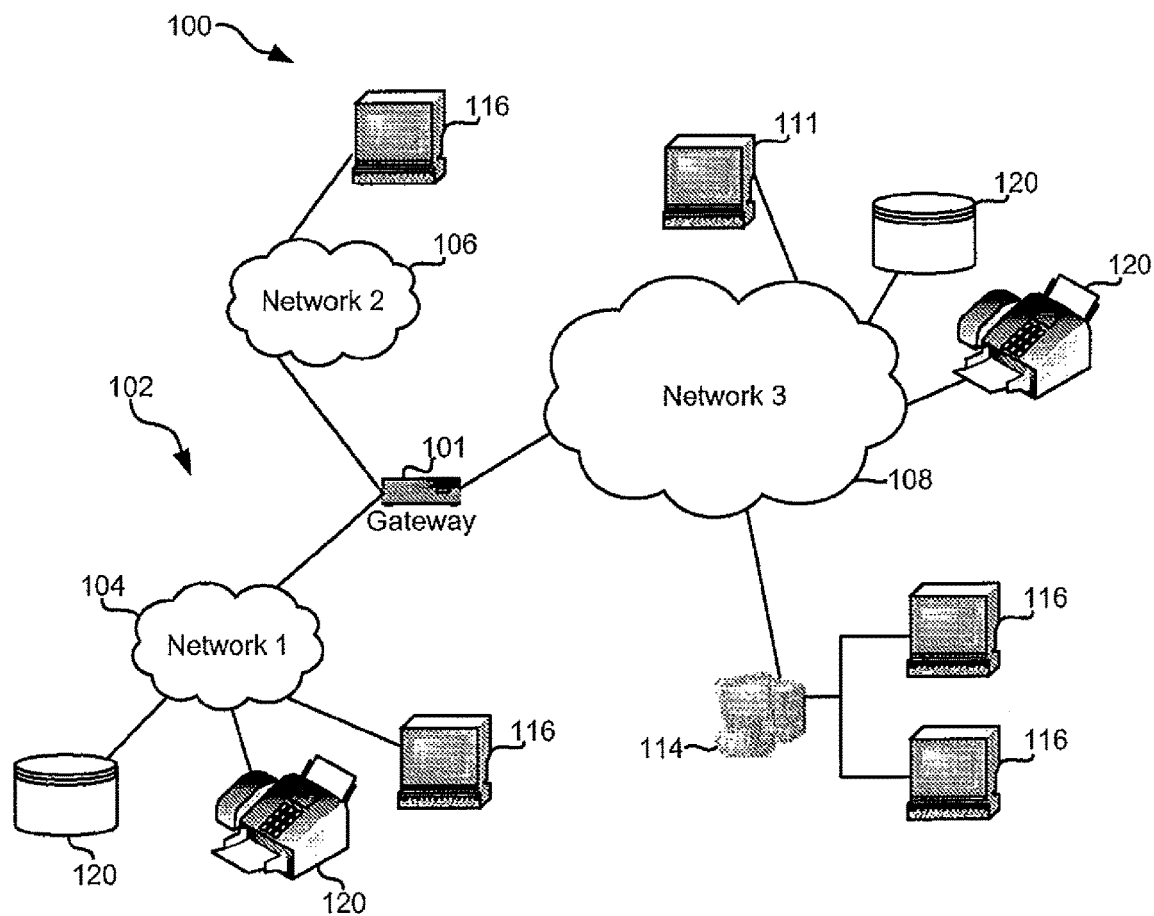
FIG. 1 illustrates a network architecture, in accordance with one embodiment.

The following description is made for the purpose of illustrating the general principles of the invention and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

The embodiments described below disclose methods for managing and compressing bitmaps.

According to one general embodiment, a method for compressing a bitmap includes receiving an uncompressed bitmap to compress, reading the uncompressed bitmap to determine a value of a bit location for all bits in the uncompressed bitmap, and creating a compressed bitmap by encoding a variable number of bytes to represent a distance between adjacent 1s in the uncompressed bitmap.

In another general embodiment, a method for compressing a bitmap includes receiving an uncompressed bitmap to compress, reading the uncompressed bitmap to determine a value of a bit location for all bits in the uncompressed bitmap, and creating a compressed bitmap by representing a distance between adjacent 1s in the uncompressed bitmap using a plurality of bits, and encoding a marker word to indicate the number of bits used to represent the distance.

In still another general embodiment, a system that comprises a processor operative to execute computer usable program code, at least one of a network interface and a peripheral device interface for receiving user input, and a computer usable medium having computer usable program code embodied therewith. The computer usable program code comprises a computer usable program code configured to receive an uncompressed bitmap to compress, computer usable program code configured to read the uncompressed bitmap to determine a value of a bit location for all bits in the uncompressed bitmap. The computer usable program code also comprises computer usable program code configured to create a compressed bitmap. The compressed bitmap is created by representing a distance between adjacent 1s in the uncompressed bitmap using a plurality of bits, and then encoding a marker word to indicate the number of bits used to represent the distance In yet another general embodiment, a computer program product for compressing a bitmap includes a computer readable storage medium having computer readable program code embodied therewith. The computer readable program code comprises computer readable program code configured to receive an uncompressed bitmap to compress, computer readable program code configured to read the uncompressed bitmap to determine a value of a bit location for all bits in the uncompressed bitmap, and computer readable program code configured to create a compressed bitmap. This computer readable program code performs at least one of: encoding a variable number of bytes to represent a distance between adjacent 1s in the uncompressed bitmap; dividing the uncompressed bitmap into a plurality of blocks including a compressed bitmap space and a gap; and representing a distance between adjacent 1s in the uncompressed bitmap using a plurality of bits and encoding a marker word to indicate the number of bits used to represent the distance.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof, A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 illustrates a network architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present network architecture 100, the networks 104, 106 may each take any suitable form including, but not limited to, a LAN, a WAN such as the Internet, PSTN, internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. Such user devices 116 may include a desktop computer, lap-top computer, hand-held computer, printer or any other type of logic device. It should be noted that a user device 111 may also be directly coupled to any of the networks, in one embodiment.

A peripheral 120, or series of peripherals, which may comprise facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

Figure 2:
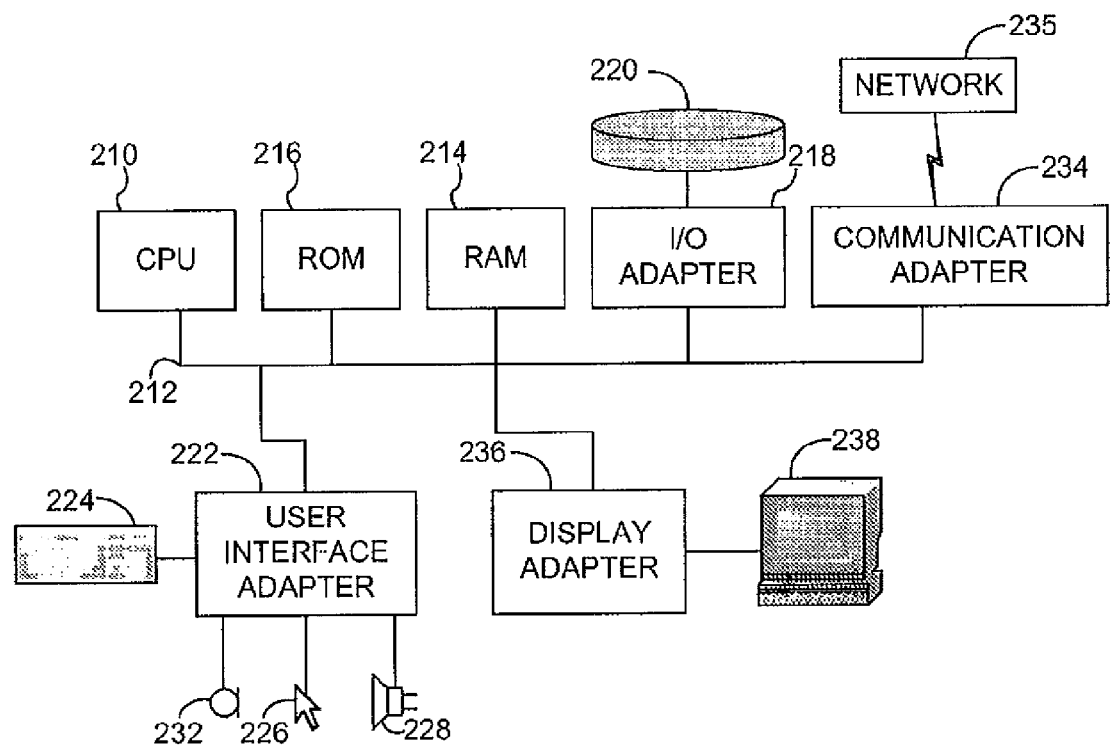
FIG. 2 shows a representative hardware environment that may be associated with the servers and/or clients of FIG. 1, in accordance with one embodiment.

FIG. 2 shows a representative hardware environment associated with a user device 116 and/or server 114 of FIG. 1, in accordance with one embodiment. The Figure illustrates a typical hardware configuration of a user device, or workstation 116, and/or server 114 that may include a central processing unit 210, such as a microprocessor, and a number of other devices interconnected via a system bus 212.

The workstation 116 shown in FIG. 2 includes a Random Access Memory (RAM) 214, Read Only Memory (ROM) 216, and an I/O adapter 218 for connecting peripheral devices such as disk storage units 220 to the bus 212. The workstation 116 also includes a user interface adapter 222 for connecting a keyboard 224, a mouse 226, a speaker 228, a microphone 232, and/or other user interface devices such as a touch screen and a digital camera (not shown) to the bus 212, a communication adapter 234 for connecting the workstation to a communication network 235 (e.g., a data processing network), and a display adapter 236 for connecting the bus 212 to a display device 238.

The workstation 116 may have resident thereon an operating system capable of running various programs. It will be appreciated that a preferred embodiment may also be implemented on any suitable platform or operating system. A preferred embodiment may be written using JAVA, XML, C, and/or C++ language, or other programming languages, along with an object oriented programming methodology. Object oriented programming (OOP), which has become increasingly used to develop complex applications, may be used.

In general, any method which may be used for compressing a bitmap may also be used for managing a plurality of bitmaps. In one embodiment, a compression method comprises measuring a distance in an uncompressed bitmap between two adjacent 1s. The distance is the number of 0s that are located between the adjacent 1s. For example, if a bitmap includes 00010000000001000, then the distance between the adjacent is would be nine 0s. In some approaches, three particularly preferred methods may be used to compress a bitmap.

Figure 3:
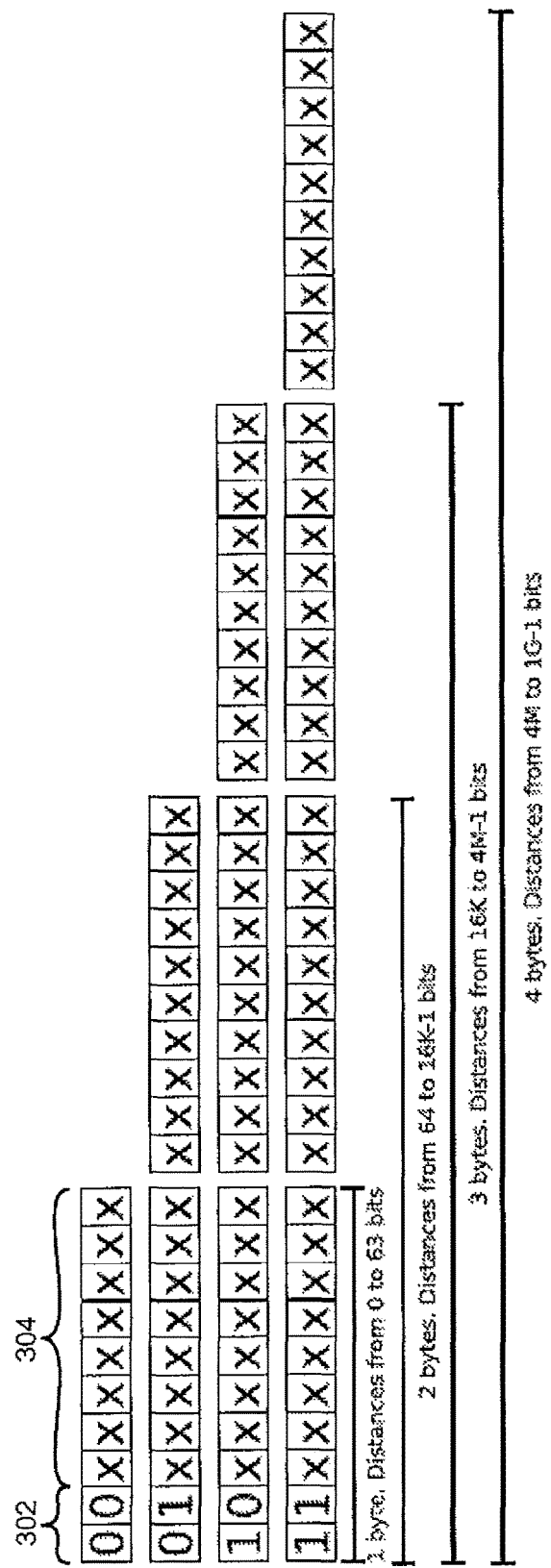
FIG. 3 is a simple diagram of a bitmap encoding structure using leading bits according to one embodiment.

A first method comprises using a variable number of bytes to represent the distance between two adjacent 1s. In one embodiment, the first two bits in a word may be used to represent the number of bytes which are used to represent the distance. For example, in FIG. 3, the first two bits 302 represent how many bytes are used to represent the distance between two adjacent 1s. 00 indicates 1 byte is being used, 01 indicates two bytes are being used, etc. If more than four bytes are to be used, then the first three bits may be used to represent how many bytes are used to represent the distance between two adjacent 1s. Of course, more or less bits may be used depending on the number of bytes used to represent the distance. As shown in FIG. 3, for shorter distances (0-63 0s) only one byte is used. The rest of the bytes 304 may be concatenated to build an integer that represents the distance. When the distance becomes longer, the number of bytes used to represent the distance will increase as well. Thus, the number of bytes used to represent a distance are not wasted.

Additionally, referring to FIG. 8, a variant of the described method may be used when the density of the bitmap to be compressed is high. In these situations, the distance between 1s generally is considerably reduced and one byte is enough to represent the distances. In rare cases, more than one byte may be used. Thus, the complete byte may be used to represent the distance between two adjacent 1s. For longer distances, a marker word may be used. Then, if a marker word is read, that indicates that the next two bytes are used to represent a jump. Two consecutive marker words indicate that the next three bytes represent the distance. Finally, for longer jumps, three marker words indicate that the next four bytes represent the distance. Using this method, one byte can represent distances from 0 to 254 between 1s, as opposed to 0 to 255, since a marker byte (say, the all-1 byte) is reserved to indicate distances longer than 254. Alternatively, two or more bytes may be reserved as markers. For example, if two bytes are reserved as marker words, then, in the absence of marker words, one byte represents distances from 0 to 253 between 1s. Longer distances may be indicated by the two marker words, and in some approaches, a plurality of marker words may be used in the same fashion as described above. When a sequence of marker words is read, the next data bytes may be concatenated to encode an integer representing the distance between 1s.

Figure 4:
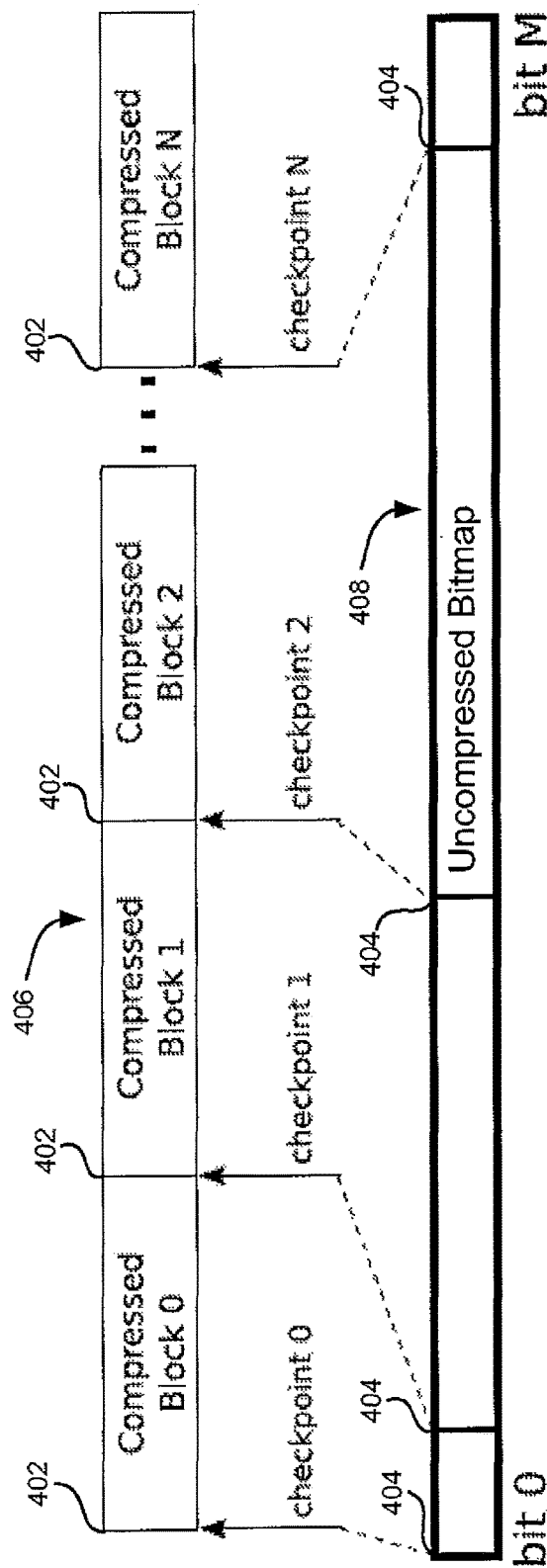
FIG. 4 is a simple diagram of a bitmap encoding structure using checkpoints according to one embodiment.

Now referring to FIG. 4, a second a variant of the described method comprises using checkpoints 402 in a compressed bitmap 406, according to one approach. These checkpoints 402 indicate a corresponding bit 404 in the uncompressed bitmap 408. The position of one bit 404 in an uncompressed bitmap 408 can be mapped into the compressed bitmap 406 using these checkpoints 402. Thus, any search may be focused in a limited block of the bitmap, without reading from the beginning of the bitmap to the position where the bit is located. This saves time and processing capacity, thereby producing a more efficient search process for the compressed bitmap.

According to one example, the uncompressed bitmap 408 includes bits from bit 0 to bit M. The compressed bitmap includes compressed data in the form of compressed blocks 406, from compressed block 0 to compressed block N. The compressed bitmap 406 also includes checkpoints 402 dispersed throughout the compressed bitmap 406. The more checkpoints 402 that are included in the compressed bitmap 406, the less data must be searched in order to find a desired block of data. If a user is performing a search on the compressed bitmap 406, typically the entire compressed bitmap 406 must be searched in order to find the data (bit or bits) desired, generally from the beginning (compressed block 0) to the end (compressed block N). However, with checkpoints 402 dispersed throughout the compressed bitmap 406, the user will only search a particular compressed block for the data desired, since each checkpoint indicates a bit 404 in the uncompressed bitmap 408, and preferably this bit 404 occurs at the beginning of a next compressed block. This allows a search to be performed on only the compressed block including the desired data, instead of on the entire compressed bitmap 406, saving time, processor capacity, etc.

Figure 5:
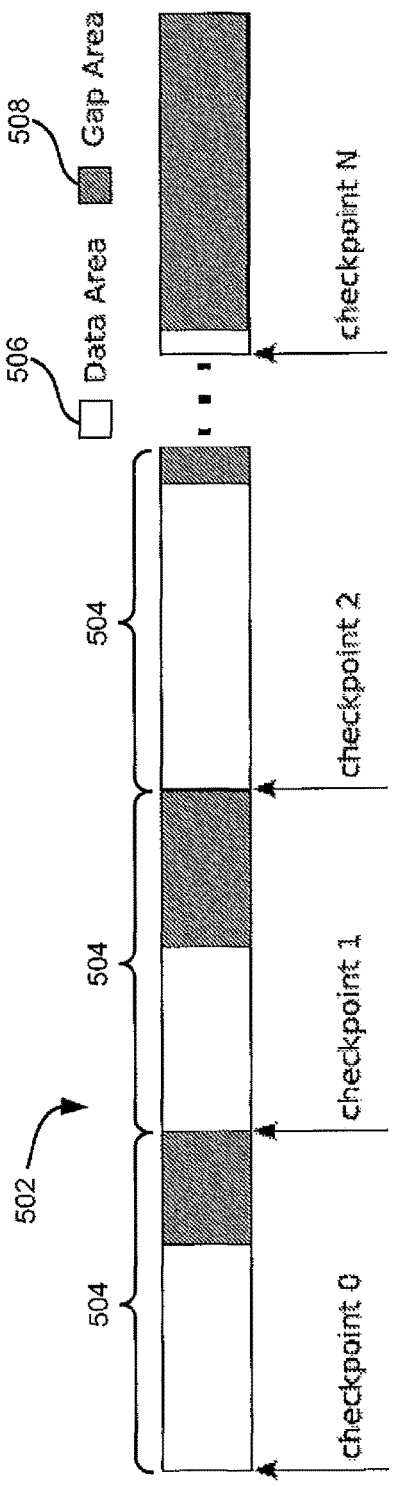
FIG. 5 is a simple diagram of a bitmap encoding structure using gap areas according to one embodiment.

With reference to FIG. 5, a third a variant of the described method, in some approaches, comprises using gap areas in a compressed bitmap. As shown in FIG. 5, an entire compressed bitmap 502 may be divided into blocks 504. Each block 504 has at least two separate areas that may comprise a data area 506 and a gap area 508, for example. The data area 506 may include, according to one approach, compressed data, while the gap area 508, in one approach, may comprise empty space in the memory. In addition, the gap areas 508 may be used for updates at some time in the future.

Figure 6:
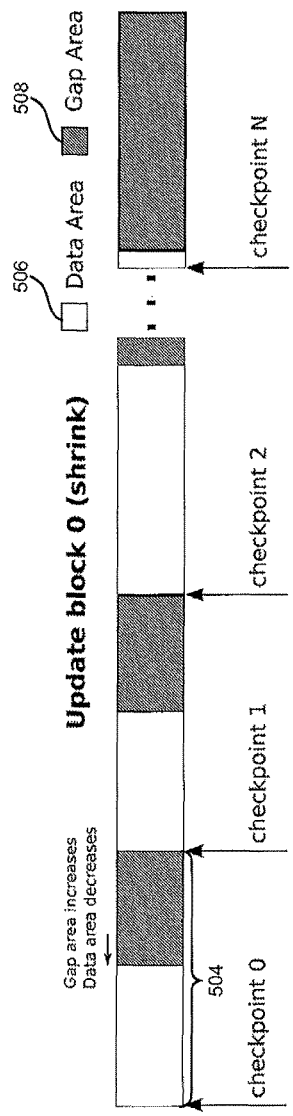
FIG. 6 is a simple diagram of a bitmap updating method which shrinks the data, according to one embodiment.
Figure 7:
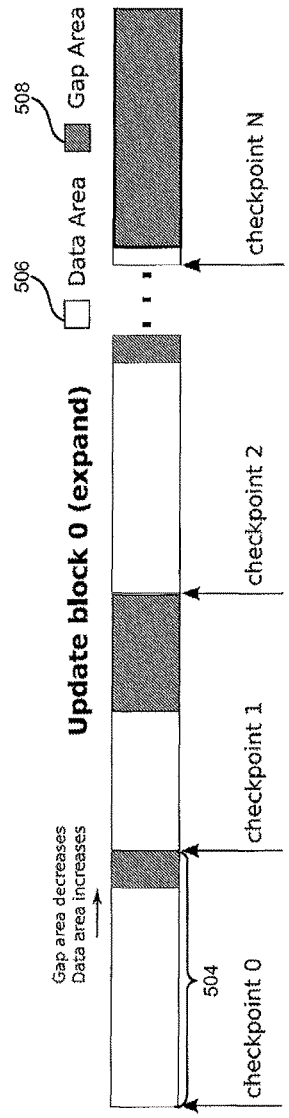
FIG. 7 is a simple diagram of a bitmap updating method which expands the data, according to one embodiment.

When an update is applied, the data area 506 in a block 504 may be shrunk, expanded, or kept at a same size, according to some approaches. Referring to FIG. 6, data may be shrunk in situations where the number of bytes stored in the block 504 is less after performing the update than it was before performing the update. As shown in FIG. 7, data may be expanded when, after performing the update, the number of bytes in the block 504 is greater than it was prior to performing the update. In these situations, the gap area 508 may be used to keep the expanded portion of the bitmap intact.

According to some approaches, a balance may be maintained between the gap areas following a heuristic function, depending on the occupancy of data areas in each block. Notice that updating a given block does not involve modifying any of the rest of the checkpoint pointers. These other pointers are updated only when gap areas are reallocated.

Thus, the disclosed method is relatively simple since there is only one type of word used.

Referring to Table 1, each column includes an indication of the column's meaning. The definition, as used herein, of each of these column labels is as follows, according to one embodiment. "Tests" means how many tests are used to select the word type for encoding. "Phases" means the number of phases that are used for coding/decoding each word. "Updates" indicates if the algorithm supports updates without re-compressing the entire bitmap. "Re-encoding" indicates if the algorithm has to encode again data after the update. "Compression ratio (5%)" indicates an approximation of the compression ratio for encoding a bitmap with a density of about 5% 1s (e.g., 5% of the bitmap is comprised of 1s, the rest 0s).

TABLE 1

| Method | Tests | Phases | Updates | Re-encoding | Compression ratio (5%) |
|---|---|---|---|---|---|
| BBC | 4 | 1 | No | N/A | 2.5 |
| WAH | 1 | 1 | No | N/A | 1 |
| WBC | 1 | 1 | No | N/A | 1 |
| RLH | 1 | 2 | No | N/A | 7 |
| RLH-N | 1 | 2 | Yes | Yes | 2 |
| Embodiment 1 | 1 | 1 | Yes | No | 2.35 to 2.5 |

As shown in Table 1, known prior art BBC method of bitmap compression obtains reasonable compression ratios, but can be relatively slow since four tests are used to compress each word. The known prior art WAH and WBC methods of bitmap compression have relatively poor compression ratios for bitmaps with densities greater than about 5%. (Note that with a density of about 5%, the compressed bitmap has almost the same size as the decompressed bitmap associated with it). Also, a problem with using known prior art RLH method for compressing bitmaps, is that this method may use significant processor time to compress/decompress the bitmap, because each word is compressed twice, instead of once. In addition, the RLH bitmap compression method uses a larger number of operations than the WAH or the BBC methods. Additionally, another drawback of the known BBC, WAH, WBC, and RLH bitmap compression methods is that they do not support updates without recompressing the entire bitmap.

Another known prior art method of bitmap compression, the RNL-H method, has disadvantages as well. First, the RNL-H method of bitmap compression can be slow because this method codes/decodes each word twice using the RLE and the Huffman methods. Second, compression ratios are not as good as the RLH method because each block is coded independently using a common Huffman tree. Third, each time an update is performed, an entire block is re-encoded. Fourth, when several updates are performed, the Huffman tree is modified to keep all new symbols updated with the corresponding frequencies. In many cases, new symbols may result in long Huffman codes that might be longer than the decompressed data it represents.

According to one embodiment, shown as Embodiment 1 in Table 1, the methods described herein may support fast updates and fast searches. Note that updates using Embodiment 1 do not require re-coding data. Only in some cases, a small portion of data may be shifted after the update, but this method is still much faster than re-coding an entire block. Moreover, compression ratios for a considerable density are very similar to the BBC algorithm, depending on the amount of space used for gaps.

Now referring to FIG. 9, one embodiment of a method 900 for compressing a bitmap is shown. The method 900 may be carried out in any desired embodiment, and may make use of a processor to perform the operations shown. Examples of a processor include a central processing unit (CPU), an application specific integrated circuit (ASIC), a field programmable gate array (FPGA), etc.

In operation 902, an uncompressed bitmap is received. This uncompressed bitmap is to be compressed through method 900. In addition, the uncompressed bitmap may have been processed through other compression methods prior to being received, may be a fully uncompressed bitmap, may be an encrypted bitmap, etc. Any type of bitmap file may be used in method 900.

In operation 904, the uncompressed bitmap is read to determine a value of a bit location for all bits in the uncompressed bitmap. For example, if the bitmap is a series of four 0s followed by a 1, followed by one hundred 0s, then during the reading process this information will be discovered, and all the locations of 1s and 0s will be identified.

In operation 906, a compressed bitmap is created by encoding a variable number of bytes to represent a distance between adjacent 1s in the uncompressed bitmap. This process encodes the compressed bitmap such that in most situations, it will be smaller in size than the uncompressed bitmap. Adjacent 1s may be defined as any 1s in the string which are not separated by another 1, for example, Ser. No. 10/000,001 includes adjacent is at the start and end of the string, whereas 000100010001 includes two sets of adjacent 1s.

According to one preferred embodiment, a first two bits in a word may be used to indicate the variable number of bytes used to represent the distance between adjacent 1s in the uncompressed bitmap. This process may be similar to that described previously.

In another approach, a plurality of check pointers may be used to indicate specific bit locations in the uncompressed bitmap within the compressed bitmap. This process may be similar to that described previously. In a further approach, determining the value of a bit location in the uncompressed bitmap may include identifying a closest check pointer prior to a bit location, and reading words in an associated block until a desired bit location is found.

Now referring to FIG. 10, a method 1000 for compressing a bitmap is shown, according to one general embodiment. The method 1000 may be carried out in any desired embodiment, and may make use of a processor to perform the operations shown. Examples of a processor include a central processing unit (CPU), an application specific integrated circuit (ASIC), a field programmable gate array (FPGA), etc.

In operation 1002, an uncompressed bitmap is received. Any method may be used to receive the bitmap, and any device may be used to receive the bitmap, such as a computer, processor, etc.

In operation 1004, the uncompressed bitmap is divided into a plurality of blocks to form a compressed bitmap. The plurality of blocks include a compressed bitmap space and a gap, such as shown in FIGS. 6 and 7, as 506 and 508, respectively.

In one approach, an update operation that changes a value in the uncompressed bitmap may update only within a single block in the compressed bitmap. In a further approach, updating a compression within a block may result in an expansion or reduction of the gap within the block.

Figure 11:
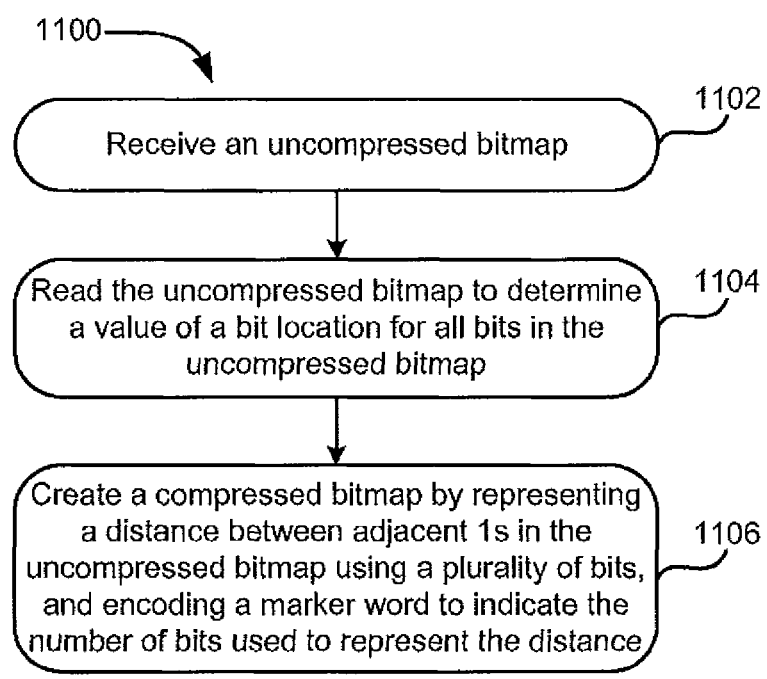
FIG. 11 is a flow chart of a method for compressing a bitmap, according to one embodiment.

In another embodiment, as shown in FIG. 11, a method for compressing a bitmap is shown. The method 1100 includes several operations, which can be performed in any order and may be executed by a computer, processor, or the like.

In operation 1102, an uncompressed bitmap to compress is received.

In operation 1104, the uncompressed bitmap is read to determine a value of a bit location for all bits in the uncompressed bitmap.

In operation 1106, a compressed bitmap is created by representing a distance between adjacent 1s in the uncompressed bitmap using a plurality of bits, and encoding a marker word to indicate the number of bits used to represent the distance.

Of course, any of the above described embodiments and approaches, may be used in conjunction with method 1100.

Figure 12:
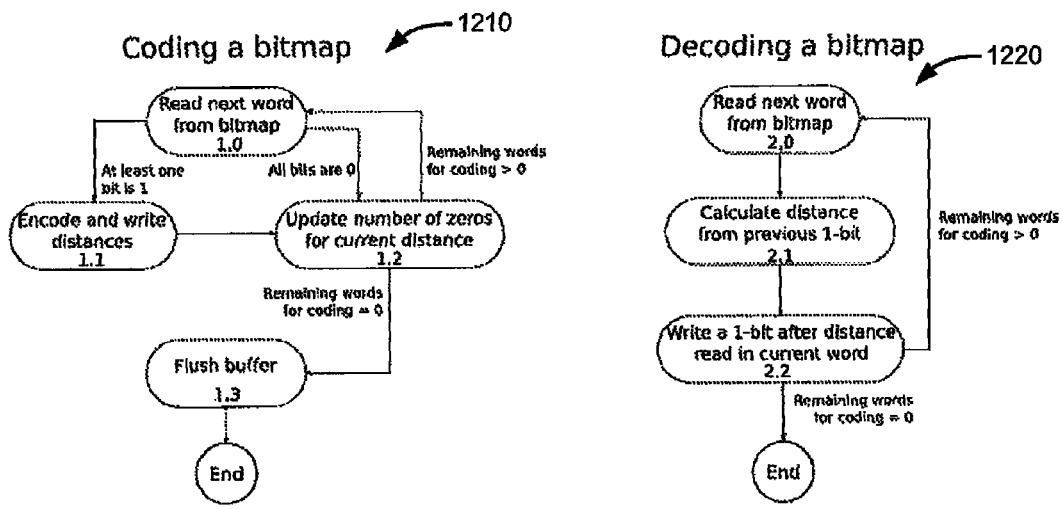
FIG. 12 includes two flowcharts showing coding of a bitmap and decoding of a bitmap, according to several embodiments.

Now referring to FIG. 12, methods for coding a bitmap 1210 and decoding a bitmap 1220 are shown, according to two embodiments. A word, in the context of a bitmap, is a collection of bits of a predetermined length. For example, some algorithms use 16 bit words in their compression schemes.

According to one embodiment, when coding a bitmap which is to be compressed 1210, a next word in the original bitmap is read (step 1.0), and it is determined if the word has at least one bit with a value of 1, or if it is all 0s. If there is at least one bit having a value of 1, then the produced bitmap is encoded and the distance between the adjacent is 1s written (step 1.1). If the word is all 0s, then the number of 0s in the current distance is updated, and it is determined if there are any remaining words. If so, then the process reads the next word (step 1.0) in the original bitmap, and if not, then the buffer is flushed (step 1.3) to end the process.

Still referring to FIG. 12, to decode a bitmap 1220, according to one approach, a next word in the original bitmap is read (step 2.0). A distance between the previous bit having a value of 1 is calculated (step 2.1), and a 1 bit is written (step 2.2) after the distance read in the current word is satisfied. Then, if there are no more words, the process ends. Otherwise, the next word is read (step 2.0).

Figure 13:
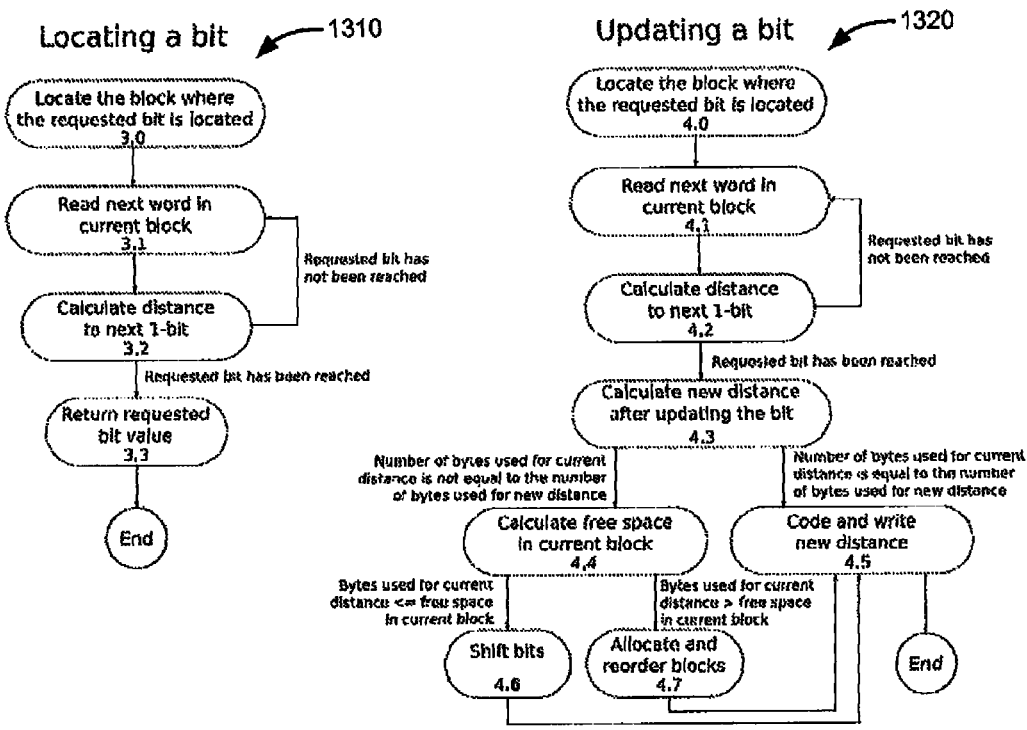
FIG. 13 includes two flowcharts showing locating a bit in a bitmap and updating a bit in a bitmap, according to several embodiments.

Now referring to FIG. 13, methods of locating a bit in a bitmap 1310 and updating a bit 1320 are shown, according to two embodiments. To locate a bit in a bitmap 1310, the block where the requested bit is located is determined (step 3.0). For example, if there are 10 blocks of data in the compressed bitmap, and the data is located in block 2, then block 2 is identified as the block where the requested bit is located. In one embodiment, checkpoints, as discussed previously, may be used to help locate the block in which the requested bit is located. Then, the next word (e.g., the first word in the block is read, and after the first word, the next word is read) in the current block is read (step 3.1), and the distance between adjacent 1s is calculated (step. 3.2). If the requested bit has not been reached, then the next word is read (step 3.1). If the requested bit has been reached, the value of the requested bit is returned (step 3.3), and the process ends.

With continued reference to FIG. 13, a procedure to update a bit 1320 is disclosed, according to one embodiment. In a first step, the block where the requested bit is located is determined (step 4.0), similar to the process disclosed above (step 3.0). Then, the next word in the current block is read (step 4.1) and the distance to the next bit having a value of 1 is calculated (step. 4.2). If the requested bit has not been reached, then the next word is read in the current block (step 4.1), similar to the process disclosed above for locating a bit 1310; otherwise, the new distance is calculated between adjacent 1s after the bit has been updated (step 4.3). If the number of bytes used for the current distance is not equal to the number of bytes used for the new distance, then the free space is calculated for the current block (step 4.4). Next, if the bytes used for the current distance is less than or equal to the free space in the current block, then the bits are shifted to accommodate for the new distance to be written (step 4.6). If the bytes used for the current distance is more than the free space in the current block, then the blocks are reallocated and reordered to accommodate for the new distance to be written (step 4.7). If the number of bytes used for the current distance is equal to the number of bytes used for the new distance, the bits have been shifted to accommodate for the new distance to be written, or the blocks have been reallocated and reordered to accommodate for the new distance to be written, then the new distance is coded and written (step 4.5). Then the process is ended.

The procedure for locating a bit 1310 and for updating a bit 1320 may share some common steps (such as steps 3.0 & 4.0, steps 3.1 & 4.1, steps 3.2 & 4.2), but when updating a bit, additional and/or alternative steps are also used.

In one embodiment, a computer program product for compressing a bitmap includes a computer readable storage medium having computer readable program code embodied therewith. The computer readable program code comprises computer readable program code configured to receive an uncompressed bitmap to compress, computer readable program code configured to read the uncompressed bitmap to determine a value of a bit location for all bits in the uncompressed bitmap, and computer readable program code configured to create a compressed bitmap. This computer readable program code performs at least one of: encoding a variable number of bytes to represent a distance between adjacent 1s in the uncompressed bitmap; dividing the uncompressed bitmap into a plurality of blocks including a compressed bitmap space and a gap; and representing a distance between adjacent 1s in the uncompressed bitmap using a plurality of bits and encoding a marker word to indicate the number of bits used to represent the distance.

In one approach, a first two bits in a word may represent the variable number of bytes used to represent the distance between adjacent 1s in the uncompressed bitmap.

According to another approach, a plurality of check pointers may be used to indicate specific bit locations in the uncompressed bitmap within the compressed bitmap. Further, determining the value of a bit location in the uncompressed bitmap may include computer readable program code configured to identify a closest check pointer prior to a bit location, and computer readable program code configured to read words in an associated block until a desired bit location is found.

In another embodiment, an update operation that changes a value in the uncompressed bitmap may update only within a single block in the compressed bitmap, in order to minimize the effect and costs associated with the update operation.

According to another approach, updating a compression within a block may result in an expansion or reduction of a gap within the block.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A method for compressing a bitmap, the method comprising:
    receiving an uncompressed bitmap to compress;
    reading the uncompressed bitmap to determine a value of a bit location for all bits in the uncompressed bitmap by identifying a closest check pointer prior to the bit location and reading words in an associated block until a desired bit location is found; and
    creating a compressed bitmap by encoding a variable number of bytes to represent a distance between adjacent 1s in the uncompressed bitmap, wherein a plurality of check pointers are used to indicate specific bit locations in the uncompressed bitmap within the compressed bitmap.

2. A system, comprising:
    a processor operative to execute computer usable program code;
    at least one of a network interface and a peripheral device interface for receiving user input; and
    a computer usable medium having computer usable program code embodied therewith, the computer usable program code comprising:
    computer usable program code configured to receive an uncompressed bitmap to compress;
    computer usable program code configured to read the uncompressed bitmap to determine a value of a bit location for all bits in the uncompressed bitmap by identifying a closest check pointer prior to the bit location and reading words in an associated block until a desired bit location is found; and
    computer usable program code configured to create a compressed bitmap by:
        representing a distance between adjacent 1s in the uncompressed bitmap using a plurality of bits; and
        encoding a marker word to indicate the number of bits used to represent the distance, wherein a plurality of check pointers are used to indicate specific bit locations in the uncompressed bitmap within the compressed bitmap.

3. A method for compressing a bitmap comprising:
receiving an uncompressed bitmap to compress;
reading the uncompressed bitmap to determine a value of a bit location for all bits in the uncompressed bitmap by identifying a closest check pointer prior to the bit location and reading words in an associated block until a desired bit location is found; and
creating a compressed bitmap by representing a distance between adjacent 1s in the uncompressed bitmap using a variable number of bits and encoding a marker word to indicate the variable number of bits used to represent the distance, wherein a plurality of check pointers are used to indicate specific bit locations in the uncompressed bitmap within the compressed bitmap.

4. The method of claim 3, wherein a first two bits in the marker word represent the variable number of bits used to represent the distance between adjacent 1s in the uncompressed bitmap.

\* \* \* \* \*